United States Patent
Habert et al.

(10) Patent No.: US 9,232,685 B2
(45) Date of Patent: Jan. 5, 2016

(54) COOLING CIRCUIT WITH A SUFFICIENTLY ACCURATELY MEASURED HEAT EXCHANGER

(71) Applicant: ABB Technology AG, Zürich (CH)

(72) Inventors: Mathieu Habert, Rheinfelden (CH); Oscar Apeldoorn, Lengnau (CH); Thomas Gradinger, Aarau Rohr (CH)

(73) Assignee: ABB TECHNOLOGY AG, Zürich (CH)

( * ) Notice: Subject to any disclaimer, the term of this patent is extended or adjusted under 35 U.S.C. 154(b) by 300 days.

(21) Appl. No.: 14/025,135

(22) Filed: Sep. 12, 2013

(65) Prior Publication Data
US 2014/0071629 A1   Mar. 13, 2014

(30) Foreign Application Priority Data
Sep. 12, 2012 (DE) .................. 20 2012 008 739 U (51) Int. Cl.
*H05K 7/20* (2006.01)
*H01L 23/427* (2006.01)
*H01L 23/473* (2006.01)

(52) U.S. Cl.
CPC .......... *H05K 7/20927* (2013.01); *H01L 23/427* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 6,772,603 B2 * | 8/2004 | Hsu et al. ..................... | 62/259.2 |
| 2003/0151893 A1 * | 8/2003 | Meyer et al. .................. | 361/688 |
| 2003/0205363 A1 * | 11/2003 | Chu et al. ..................... | 165/80.3 |
| 2005/0094373 A1 * | 5/2005 | Weber et al. .................. | 361/699 |
| 2006/0002086 A1 * | 1/2006 | Teneketges et al. .......... | 361/699 |
| 2006/0180300 A1 * | 8/2006 | Lenehan et al. .............. | 165/247 |
| 2006/0196643 A1 * | 9/2006 | Hata et al. ................ | 165/104.33 |
| 2007/0297136 A1 * | 12/2007 | Konshak ........................ | 361/699 |
| 2008/0310112 A1 * | 12/2008 | Long et al. .................... | 361/701 |
| 2008/0315736 A1 * | 12/2008 | Yamada et al. ............... | 312/236 |
| 2009/0109713 A1 * | 4/2009 | Schnetzka et al. ............. | 363/34 |
| 2009/0115491 A1 * | 5/2009 | Anwar et al. ................. | 327/512 |

(Continued)

*Primary Examiner* — Anthony Haughton
*Assistant Examiner* — Razmeen Gafur
(74) *Attorney, Agent, or Firm* — Buchanan Ingersoll & Rooney PC (57) ABSTRACT

An exemplary power electronics module includes a first power electronics element that generates a first heat flow during operation of the power electronics module, a second power electronics element that generates a second heat flow during operation of the power electronics module. The first cooler is in thermal contact with the first power electronics element to receive at least part of the first heat flow. The second cooler is in thermal contact with the second power electronics element to receive at least part of the second heat flow. A heat exchanger is configured to transmit at least part of the first heat flow and the second heat flow to a primary cooling flow and transfer heat flow in a thermally efficient manner. A magnitude of the heat flow is less than a total magnitude that is formed from a maximum first heat flow and a maximum second heat flow.

18 Claims, 3 Drawing Sheets

(56) References Cited

U.S. PATENT DOCUMENTS

| | | | |
|---|---|---|---|
| 2010/0128436 A1* | 5/2010 | Edmunds et al. | 361/700 |
| 2010/0232110 A1* | 9/2010 | Ippoushi et al. | 361/699 |
| 2010/0254089 A1* | 10/2010 | Anderl et al. | 361/702 |
| 2010/0277870 A1* | 11/2010 | Agostini | 361/701 |
| 2010/0302733 A1* | 12/2010 | Woody et al. | 361/699 |
| 2010/0309630 A1* | 12/2010 | Jones et al. | 361/694 |
| 2010/0315781 A1* | 12/2010 | Agostini | 361/700 |
| 2011/0019160 A1* | 1/2011 | Kitano et al. | 353/57 |
| 2011/0194256 A1* | 8/2011 | De Rijck et al. | 361/717 |
| 2011/0228485 A1* | 9/2011 | Usui et al. | 361/720 |
| 2011/0292600 A1* | 12/2011 | Campbell et al. | 361/691 |
| 2011/0292601 A1* | 12/2011 | Campbell et al. | 361/691 |
| 2011/0317366 A1* | 12/2011 | Fukutani et al. | 361/699 |

* cited by examiner

COOLING CIRCUIT WITH A SUFFICIENTLY ACCURATELY MEASURED HEAT EXCHANGER

RELATED APPLICATION(S)

This application claims priority under 35 U.S.C. §119 to German Application DE 202012008739.8 filed in Germany on Sep. 12, 2012. The content of which is hereby incorporated by reference in its entirety.

FIELD

The disclosure relates to the field of heat transfer in power electronics from a power electronics module, or from a converter that includes a power electronics module, in particular by means of a thermosiphon cooling circuit.

BACKGROUND INFORMATION

Electrical and electronic elements in the field of power electronics are often understood to be semiconductor, elements, for example insulated gate bipolar transistors (IGBT's), thyristors, diodes, resistors, metal oxide semiconductor field effect transistors (MOSFETs), and combinations of components of this type and the like. The term "power electronics" is understood to include hereinunder power electronics elements that during operation can include a cutoff voltage of more than 500 volts. These electrical and electronic elements should be cooled during operation owing to the fact that as a result of the extremely high power densities they generate likewise extremely high thermal flows that should be efficiently transferred. In modern converters, these power electronics elements are often combined into groups in power modules. A converter can be used, for example, to drive an industrial mill, a vehicle, a ship and/or for the purpose of voltage conversion or converting voltage.

If the heat is not transferred from the semiconductor elements, said elements can become damaged and in the extreme case this can lead to an operator of the converter having to suffer interruptions in the operation as a result of repair work. Such interruptions in the operation should be avoided due to the fact that the interruptions can lead to considerable economic disadvantages for the operator of the converter.

Since the power density per structural volume of the converter increases with the ever-reducing size of converters, the specification for compact but nonetheless efficient cooling systems increases. Heat flows in power electronics can be transferred from a converter during operation of the converter by way of a cooling water flow that is connected to the converter or by way of a cooling air flow of a primary circuit by way of a heat exchanger. The heat flows of the power electronics elements are transferred to the primary cooling flow by means of a secondary cooling circuit by way of a heat exchanger.

Both when the primary cooling flow is in the form of a cooling water flow and also when the primary cooling flow is in the form of a cooling air flow, the magnitude of the heat energy that is to be thermally transferred from the secondary cooling circuit by way of the heat exchanger to the primary cooling flow can be significant because this magnitude influences the provision of installation space for the purpose of accommodating cooling channels of sufficient cross section, and also for accommodating pumps, fans and the like.

SUMMARY

An exemplary power electronics module is disclosed, comprising: a first power electronics element that generates a first heat flow during operation of the power electronics module; a second power electronics element that contributes to the generation of a second heat flow during operation of the power electronics module; and a secondary cooling circuit having a first cooler, wherein the first cooler is in thermal contact with the first power electronics element to receive at least part of the first heat flow, wherein the second cooler is in thermal contact with the second power electronics element to receive at least part of the second heat flow, wherein the heat exchanger is configured to transfer at least part of the first heat flow and the second heat flow to a primary cooling flow during the operation of the power electronics module, and wherein the heat exchanger is configured to be thermally efficient for transferring a heat flow such that the magnitude of said heat flow is less than a total magnitude that is formed from a maximum first heat flow and a maximum second heat flow.

An exemplary converter is disclosed comprising: at least one power electronics module having: a first power electronics element that generates a first heat flow during operation of the power electronics module; a second power electronics element that contributes to the generation of a second heat flow during operation of the power electronics module; and a secondary cooling circuit having a first cooler, wherein the first cooler is in thermal contact with the first power electronics element to receive at least part of the first heat flow, wherein the second cooler is in thermal contact with the second power electronics element to receive at least part of the second heat flow, wherein the heat exchanger is configured to transfer at least part of the first heat flow and the second heat flow to a primary cooling flow during the operation of the power electronics module, and wherein the heat exchanger is configured to be thermally efficient for transferring a heat flow such that the magnitude of said heat flow is less than a total magnitude that is formed from the maximum first heat flow and the maximum second heat flow.

BRIEF DESCRIPTION OF THE DRAWINGS

Several exemplary embodiments of the disclosure are explained in detail hereinunder with reference to the drawing, in which purely schematically.

The reference numerals used in the drawing and their relevance are summarized in the list of reference numerals. Fundamentally, like parts in the figures are provided with like reference numerals. The described embodiments represent examples of the subject matter of the disclosure and do not have any limiting effect.

DETAILED DESCRIPTION

Exemplary embodiments of the disclosure is to provide an improved power electronics module and an improved converter with which the specified installation space can be reduced in comparison to known power electronics modules and/or converters of the same power rating. The term "installation space" is understood to refer to the amount of space called for with respect to its spatial dimensional measurements.

During operation, known power electronics modules can includes not only a first operating state but also a second operating state (e.g. a switched state) in which the electrical circuit of the power electronics elements is different to the first operating state. Accordingly, not only do the first power electronics elements that are allocated to the first switched case call for thermal cooling but also the power electronics elements that are allocated to the second switched case specify cooling. For this purpose, often the first power electronics elements are in thermal contact with the first power electronics elements by way of a first cooler for the purpose of receiving the first heat flow, whereas often the second power electronics elements are in thermal contact with the second power electronics elements by way of a second cooler for the purpose of receiving the second heat flow.

If during operation, specific power electronics elements generate a heat flow both in the first operating state and also in the second operating state, which heat flow is to be transferred to the primary cooling flow by way of the heat exchanger, then the heat exchanger would be embodied in a thermally efficient manner for a heat flow that can be transferred, the magnitude of which heat flow corresponds to the total magnitude of the maximum first heat flow and the maximum second heat flow. As a result, both the heat exchanger and also the primary cooling flow together with its channel elements and driving means would be dimensioned accordingly for the purpose of generating the primary cooling flow, for example of a pump or a fan.

However, it has been demonstrated upon closer examination that the maximum first heat flow occurs in a first operating state of the power electronics module, whereas the maximum second heat flow occurs in a second operating state of the power electronics module, which second operating state is offset with respect to time in relation to the first operating state, so that the total magnitude of the maximum first heat flow and the maximum second heat flow in reality hardly ever occurred and should not have been required to be transferred to the primary cooling flow since the actual heat flow to be transferred was always less. Consequently, it has been demonstrated that the hitherto primary cooling flow and all the elements, such as channel cross section, pumps, fans and the like, that are allocated to the hitherto primary cooling flow were always over-dimensioned.

In comparison to known solutions, it is possible with a solution in accordance with the exemplary embodiments disclosed herein to keep the size of the installation space of the heat exchanger smaller, in that the power electronics module includes (e.g., comprises) the following elements in the following configuration:

a first power electronics element that generates a first heat flow during operation of the power electronics module;

a second power electronics element that generates a second heat flow during operation of the power electronics module;

a secondary cooling circuit having a first cooler, a second cooler and a heat exchanger; wherein the first cooler is in thermal contact with the first power electronics element for the purpose of receiving the first heat flow, and wherein the second cooler is in thermal contact with the second power electronics element for the purpose of receiving the second heat flow;

the heat exchanger is embodied for the purpose of transmitting at least part of the first heat flow and of the second heat flow to a primary cooling flow during the operation of the power electronics module;

the heat exchanger in accordance with the disclosure is embodied in a thermally efficient manner for a heat flow that can be transferred, the magnitude of which heat flow is less than a total magnitude that is formed from the maximum first heat flow and the maximum second heat flow.

As has already been mentioned in short, a first advantage of a power electronics module of this type resides in the fact that the heat exchanger specifies a comparatively smaller installation space than known heat exchangers in power electronics modules of the same power rating. As a result, it is consequently possible to achieve power electronics modules that are more compact with respect to their volume.

A further advantage resides in the fact that the heat exchanger in accordance with the disclosure calls for less power from the primary cooling flow in comparison to known heat exchangers in power electronics modules of the same power rating. As a result, the specified power capacities of the means for generating the primary flow, such as fans in the case of an air cooling system or a pump unit in the case of a liquid cooling system possibly in the form of water cooling, are reduced. This renders it possible, for example to use fans or pumps of a lower power rating than hitherto. Fans or pumps of this type are not only often more compact but they are also considerably less expensive than the types of a higher power rating that have been used hitherto.

Depending upon the embodiment of the power electronics module, the secondary cooling circuit can be a liquid circuit in which the working medium remains substantially always in a liquid state, or however said secondary cooling circuit can be a thermosiphon cooling circuit in which the working medium is evaporated in at least one evaporator and subsequently condensed in a condenser and returned to the evaporator in a liquid form in order to repeat the cycle. In this case, the first cooler is embodied by a first evaporator and the second cooler is embodied by a second evaporator, wherein the heat exchanger includes a condenser for liquefying a working medium of the secondary cooling circuit.

In an exemplary embodiment in which the secondary cooling circuit is a thermosiphon cooling circuit, it is advantageous with respect to the thermal efficiency factor when the secondary cooling circuit is embodied in the form of a closed loop (as a loop-type thermosiphon).

In an exemplary embodiment in which a plurality of coolers and a plurality of power electronics elements are arranged to form an assembly, for example a stack (known in English as a "press-pack stack"), if the first cooler is of the liquid type and is arranged always in parallel with the second cooler in the cooling circuit, this then can apply if the first cooler and the second cooler are of the same type and therefore experience the same pressure drop by way of the cooler, in other words between a first cooling connection (inlet) and a second cooling connection (outlet). A further advantage resides in the fact that in contrast to a series arrangement of the cooler in the secondary circuit, the two coolers receive a working medium at approximately the same input temperature and not a working medium that has already been pre-warmed by a cooler that lies upstream in the fluid circuit, so that the thermal efficiency factor is comparatively higher.

It is possible to achieve good thermal results using a power electronics module in accordance with exemplary embodiments disclosed herein if the second power electronics element is different from the first power electronics element, for example, of a different type. This result applies if the first power electronics element and the second power electronics element are arranged and configured in such a manner that the maximum first heat flow occurs in a first operating state of the power electronics module, whereas the maximum second heat flow occurs in a second operating state of the power electronics module, which second operating state is offset with respect to time in relation to the first operating state. Depending upon the respective embodiment of the power electronics module, the magnitude of the first heat flow in the first operating state is greater than the magnitude of the first heat flow in the second operating state, and the magnitude of the second heat flow in the second operating state is greater than the magnitude of the second heat flow in the first operating state.

The points mentioned in relation to the power electronics module also apply for the converter or rather can also apply to a converter.

If high power densities are to be achieved, in an exemplary embodiment the power electronics elements and the evaporator can be arranged in such a manner that they form a stack. Depending upon the embodiment, a stack in which power electronics elements and evaporators are arranged in an alternating sequence.

Depending upon which possible devices are already provided in the environment of the converter and/or of the power electronics module and are used for cooling other devices, it can be advantageous if these devices that are used for cooling purposes are likewise used to introduce a cooling effect in the power electronics elements. Accordingly, the primary cooling flow can be a liquid cooling flow with a water content or it can be a gaseous cooling flow. Depending upon the embodiment of a gaseous cooling flow, this can be, for example, an exhaust gas flow or an air flow.

In the event that the power electronics module in the converter should be replaceable in an easy and rational manner, good results can be achieved if the at least one power electronics module can be inserted into the converter and withdrawn from the converter in a drawer-like manner, wherein the heat exchanger is arranged on this power electronics module. The advantage is further increased if a converter includes a plurality of power electronics modules of this type, which can be inserted into the converter and removed from said converter in this manner.

Figure 1:
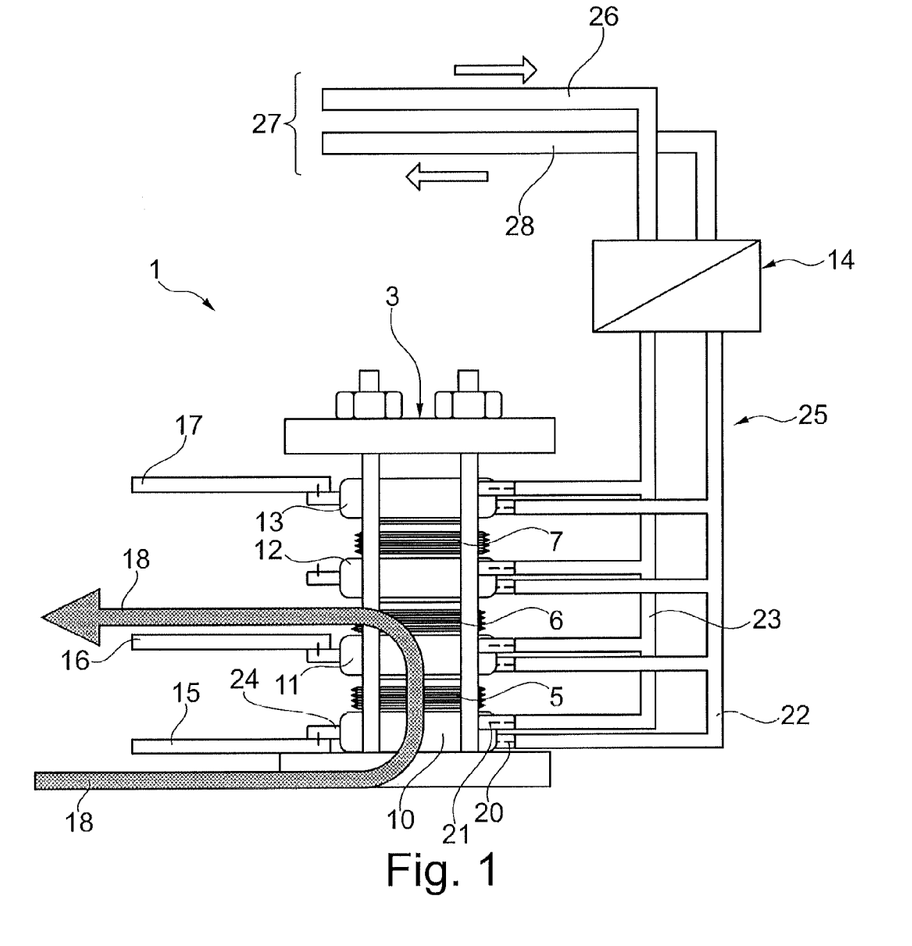
FIG. 1 illustrates a power electronics module in a first operating state in accordance with an exemplary embodiment of the present disclosure.

FIG. 1 illustrates a power electronics module in a first operating state in accordance with an exemplary embodiment of the present disclosure. The power electronics module 1 includes three power electronics elements that are clamped together alternating with a plurality of coolers to form a stack 3.

Figure 2:
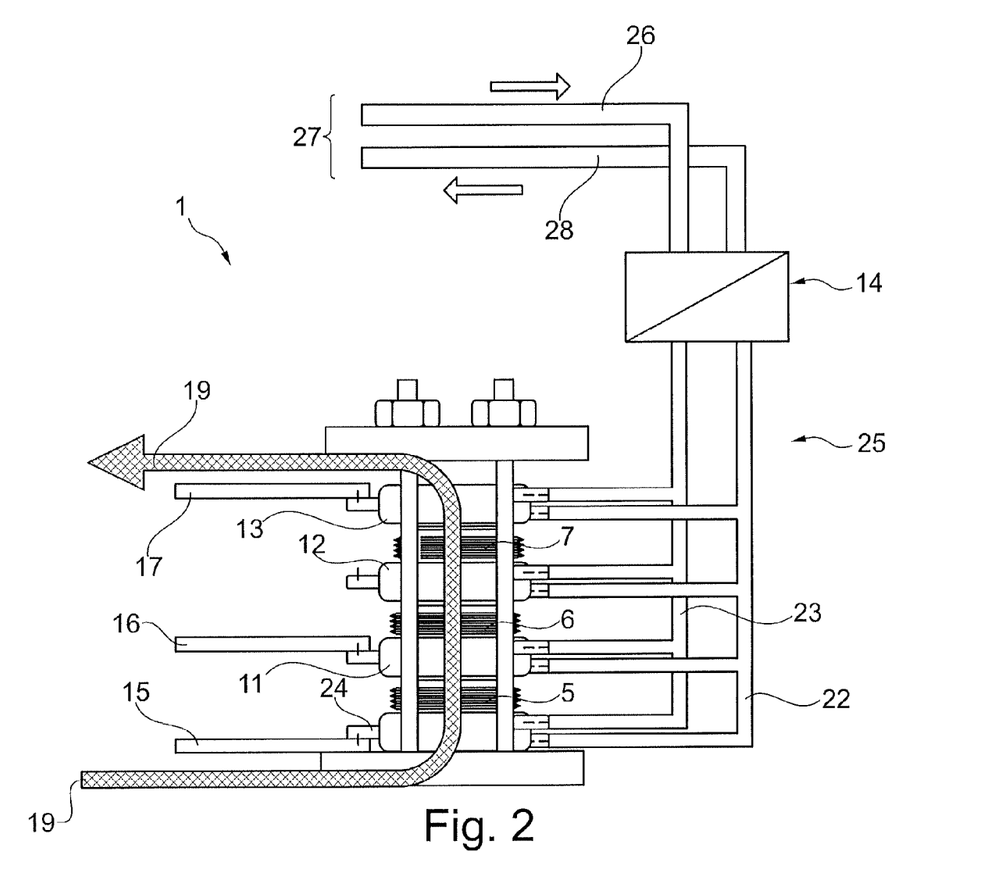
FIG. 2 illustrates a power electronics module as shown in FIG. 1 in a second operating state in accordance with an exemplary embodiment of the present disclosure.

FIG. 2 illustrates a power electronics module as shown in FIG. 1 in a second operating state in accordance with an exemplary embodiment of the present disclosure;

For explanatory purposes, of the three power electronics elements the power electronics element that is arranged in the lowest position in stack 3 is referred to as the "first power electronics element" 5, whereas the power electronics element that follows on in the vertical direction of the stack 3 is referred to hereinunder as the "second power electronics element" 6. The third power electronics element 7 that is arranged in the uppermost position in the stack 3 can be in turn of the type of the first power electronics element 5 but it does not necessarily have to be so. It is further mentioned for the sake of clarity that the second power electronics element 6 can have two switched positions, namely in its first switched position the nominal current can pass through and in its second switched position the flow of the nominal current is blocked. The second power electronics element 6 is located in the first switched position when the power electronics module 1 is in the first operating state, whereas said second power electronics element is located in the second switched position when the power electronics module 1 is in the second operating state. The transition from the first operating state into the second operating state can occur extremely rapidly, in other words within fractions of a second.

The above described structure and the function of the power electronics module 1 are to be understood as examples. In variations of the power electronics module, the second power electronics element can be, for example, a snubber diode and a further semi-conductor element, which can protect the third power electronics element 7 and the elements connected thereto from becoming unintentionally damaged as a result of an overvoltage, in that they divert the current flow entering the stack into a different current path (in most cases temporarily). In this case, however, the structure of the stack 3 would then be different to the structure illustrated in FIG. 1, in that the structure would include known internal rails and insulating pieces, so that the three power electronics elements 5, 6, 7 would no longer be electrically connected in series, as illustrated in FIG. 1 and FIG. 2. Since a detailed illustration and description would be detrimental to the understanding of the novel exemplary embodiments disclosed herein, reference is made to the greatly simplified switching options of the power electronics module 1.

Referring once again to the stack 3 as shown in FIG. 1, a first cooler 10 for the purpose of receiving a heat flow of the first power electronics element 5 is arranged below the first power electronics element 5. A second cooler 11 is arranged between the first power electronics element 5 and the second power electronics element 6, which second cooler is used both for the purpose of receiving a heat flow of the first power electronics element 5 and also a heat flow of the second power electronics element 6. A third cooler 12 is arranged between the second power electronics element 6 and the third power electronics element 7, which third cooler is used both for the purpose of receiving a heat flow of the second power electronics element 6 and also a heat flow of the third power electronics element 7. Finally, a fourth cooler 13 is arranged on the side of the third power electronics element 7 that is remote from the third cooler 12, which fourth cooler is likewise involved in receiving a heat flow of the third power electronics element 7.

In other words, all the power electronics elements 5, 6, 7 are arranged in a sandwich-type manner between in each case a cooler pair, 10, 11; 11, 12; 12, 13.

Each cooler 10, 11, 12, 13 includes a connection bracket 24 for the purpose of electrically tapping an electrical current. However, in the case of the power electronics module 1 as shown in FIG. 1, the respective electric current is not tapped at all the coolers of the power electronics module 1, on the contrary, current is only tapped at the first cooler 10 that is electrically connected for this purpose to an input current rail 15, at the second cooler that is electrically connected for this purpose to a bypass current rail 16, and at the fourth cooler 13 that is electrically connected for this purpose to an output current rail 17.

The second power electronics element 6 is located in the first switched position when the power electronics module 1 is in the first operating state, whereas said second power electronics element is located in the second switched position when the power electronics module 1 is in the second operating state. Although in the case of high-voltage switching systems it may be no longer possible using a single component to manage a switching behavior of this type, the second power electronics element 6 can be understood for the purpose of explaining the disclosure as an electrical two-way switch that both in the first operating state and also in the second operating state of the power electronics module 1 generates a second heat flow, since an expert in this field knows specifically how to build the mechanical structure of a stack.

In the first operating state of the power electronics module 1, the second power electronics element 6 therefore blocks the current flow that is entering the stack 3 by way of the first cooler 10 from flowing through the stack at the second cooler 11, so that the current flow exits the stack 3 by way of the bypass current rail 16 along a first current path 18.

In the second operating state of the power electronics module 1, the second power electronics element 6 directs the current that is entering the stack 3 by way of the first cooler 10 through the second cooler 11 and onwards by way of the third power electronics element 7 to the fourth cooler 13 and the outlet current rail 16 along a second flow path 19 and electrically blocks the flow path to the bypass current rail 16.

Each cooler 10, 11, 12, 13 includes a first cooling connection 20 and a second cooling connection 21, which are connected in a fluid-transporting manner to a heat exchanger 14 in each case by way of a first pipe system 22 and a second pipe system 23, and thus embody a secondary cooling circuit 25 in the form of a closed loop. In order to avoid an electrical short circuit between two adjacent coolers that during the operation of the power electronics module 1 have different electrical potentials, the first pipe system 22 and the second pipe system 23 are at least in parts electrically insulating, whereas the working medium of the secondary cooling circuit is electrically insulating.

During the operation of the power electronics module 1, the heat exchanger 14 transfers a predominant part of the total magnitude of all heat flows that are received by the coolers to a primary cooling flow 26 of a primary cooling system 27. If the primary cooling system is likewise a (closed) cooling circuit, the heat flow from the first pipe system 22 exits the heat exchanger by way of a primary flow return line 28.

In the present embodiment of the power electronics module 1, the secondary cooling circuit 25 is a thermosiphon cooling circuit in which a working medium evaporates in at least one of the coolers 10, 11, 12, 13 that are functioning as evaporators and subsequently condenses in the heat exchanger 14 that is functioning as a condenser and is returned in a liquid form to the evaporators 10, 11, 12, 13 in order to repeat the cycle.

Figure 3:
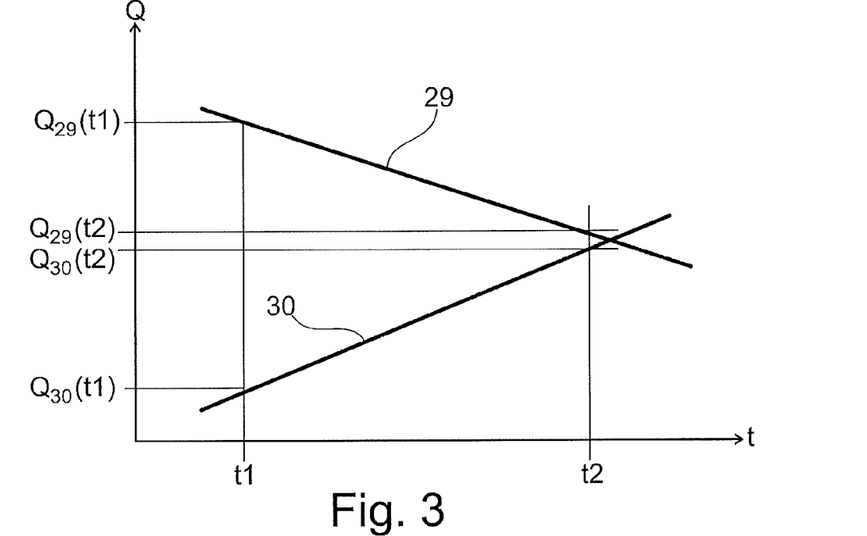
FIG. 3 illustrates a heat flow/time graph of the power electronics module with two different power electronics elements during the transition from the first operating state to the second operating state in accordance with an exemplary embodiment of the present disclosure.

FIG. 3 illustrates a heat flow/time graph of the power electronics module with two different power electronics elements during the transition from the first operating state to the second operating state in accordance with an exemplary embodiment of the present disclosure. The first power electronics element 5 is configured and arranged differently in relation to the second power electronics element 6 with respect to the electrical switching behavior and the switching arrangement in the power electronics module 1. The load characteristic curves of the heat flows 29, 30 of the first power electronics elements 5 and/or of the second power electronics elements 6 are accordingly different.

Figure 4:
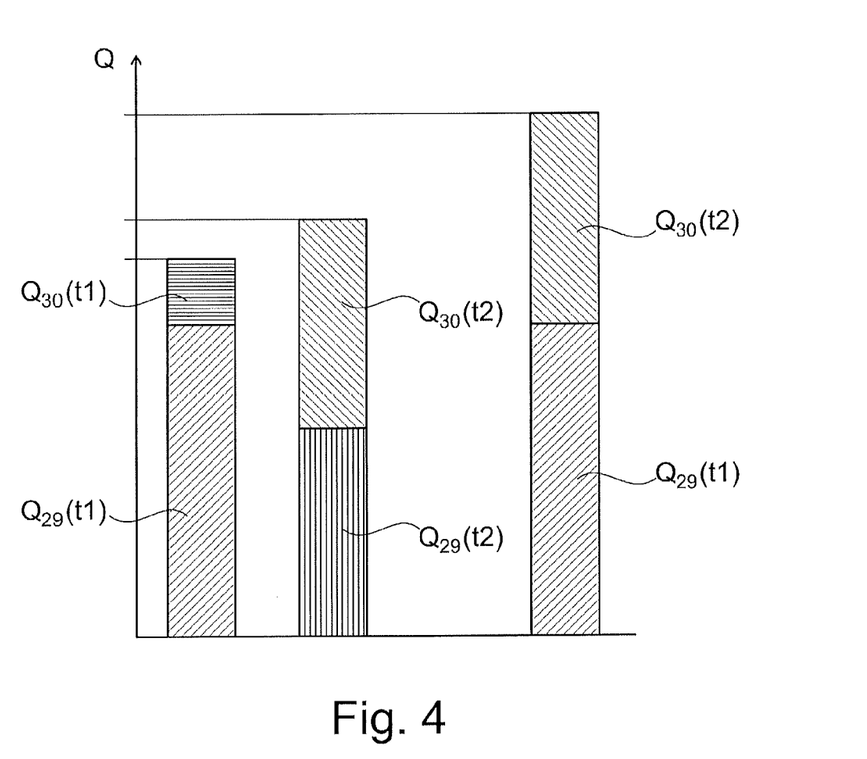
FIG. 4 illustrates a comparative representation of the heat flows of two different power electronics elements of the power electronics module with respect to values determined for known maximum heat flows in accordance with an exemplary embodiment of the present disclosure.

FIG. 4 illustrates a comparative representation of the heat flows of two different power electronics elements of the power electronics module with respect to values determined for known maximum heat flows in accordance with an exemplary embodiment of the present disclosure.

When operating the power electronics module 1 in the first operating state at the point in time t1, the first power electronics element 5 generates a first heat flow 29 whereas the second power electronics element 6 generates a second heat flow 30. The first heat flow 29 and the second heat flow 30 are transferred by way of the secondary circuit 25 to the primary cooling system 27. Since the second power electronics element 6 at this point in time t1 blocks the first current flow 18 and diverts said current flow in the direction of the bypass current rail 16, the magnitude of the second heat flow 30 is smaller than the magnitude of the first heat flow 29.

When operating the power electronics module 1 in the first operating state at the point in time t1, the first heat flow 29 is transferred to the secondary circuit 25 by way of the coolers 10, 11, whereas the second heat flow 30 is transferred to the secondary circuit 25 by way of the coolers 11, 12.

As is evident when comparing FIG. 3 with FIG. 4, when operating the power electronics module 1 in the second operating state at the point in time t2, the first power electronics element 5 generates a first heat flow 29 the magnitude of which is less than the magnitude of the first heat flow 29 in the first operating state. This is as a result of the fact that the voltage across the power electronics module 1 then drops no longer solely across the first power electronics element 5 but also across all the power electronics elements 5, 6, 7 together. Since the second power electronics element 6 at this point in time t2 directs the second current flow 19 in the direction of the outlet-current rail 17 and blocks the first current path 18 in the direction of the bypass-current rail 16, the magnitude of the second heat flow 30 in the second operating state (at the point in time t2) is greater than the magnitude in the first operating state (at the point in time t1).

For comparison purposes, the maximum first heat flow 29 ($Q_{29}$(t1) at the point in time t1) and the maximum second heat flow 30 ($Q_{30}$(t2) at the point in time t2) are illustrated on the right in the column shown in the style of a column graph. As mentioned above, the heat exchanger 14 is selected according to this combined heat flow. Since the column of the combined heat flow in the second operating state with $Q_{29}$(t2) plus $Q_{30}$(t2) is greater than in the first operating state with $Q_{29}$(t1) plus $Q_{30}$(t1), yet the magnitude is considerably less that the combined heat flow according to the selected column with $Q_{29}$(t1) plus $Q_{30}$(t2) (far right in the column graph), the thermal capacity of the heat exchanger can be measured more accurately than hitherto since the cooling capacity that prevails in the second operating state with $Q_{29}$(t2) plus $Q_{30}$(t2) is sufficient for the purpose of transmitting a sufficient magnitude of the first heat flow 29 and of the second heat flow 30 to the secondary circuit 25.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE NUMERALS

1 Power electronics module
3 Stack
5 First power electronics element
6 Second power electronics element
7 Third power electronics element
10 First cooler/evaporator
11 Second cooler/evaporator
12 Third cooler/evaporator
13 Fourth cooler/evaporator
14 Heat exchanger/condenser
15 Inlet-current rail 16 Bypass-current rail
17 Outlet-current rail
18 First current flow/current path
19 Second current flow/current path
20 First cooling connection
21 Second cooling connection
22 First pipe system
23 Second pipe system
24 Connection bracket
25 Secondary cooling circuit
26 Primary cooling current
27 Primary cooling system
28 Primary flow return pipe
29 First heat flow
30 Second heat flow

What is claimed is:

1. A power electronics module, comprising:
a first power electronics element that generates a first heat flow during operation of the power electronics module;
a second power electronics element that contributes to the generation of a second heat flow during operation of the power electronics module; and
a secondary cooling circuit having a first cooler,
wherein the first cooler is in thermal contact with the first power electronics element to receive at least part of the first heat flow,
wherein the second cooler is in thermal contact with the second power electronics element to receive at least part of the second heat flow,
wherein the heat exchanger is configured to transfer at least part of the first heat flow and the second heat flow to a primary cooling flow during the operation of the power electronics module, and
wherein the heat exchanger is configured to be thermally efficient for transferring a heat flow such that the magnitude of said heat flow is less than a total magnitude that is formed from a maximum first heat flow and a maximum second heat flow.

2. The power electronics module as claimed in claim 1, wherein the secondary cooling circuit is embodied as a cooling circuit in the form of a closed loop.

3. The power electronics module as claimed in claim 2, wherein the first cooler is arranged in a fluid-transporting manner and in parallel with a second cooler in the secondary cooling circuit.

4. The power electronics module as claimed in claim 2, wherein the secondary cooling circuit is a thermosiphon cooling circuit, wherein the first cooler is a first evaporator, and the second cooler is a second evaporator, and wherein a heat exchanger includes a condenser for the purpose of liquefying a working medium of the secondary cooling circuit.

5. The power electronics module as claimed in claim 3, wherein the secondary cooling circuit is a thermosiphon cooling circuit, wherein the first cooler is a first evaporator, and the second cooler is a second evaporator, and wherein the heat exchanger includes a condenser for the purpose of liquefying a working medium of the secondary cooling circuit.

6. The power electronics module as claimed in claim 1, wherein the second power electronics element is of a different type than the first power electronics element.

7. The power electronics module as claimed in claim 1, wherein the first power electronics element and the second power electronics element are arranged and configured such that the maximum first heat flow occurs in a first operating state of the power electronics module, and the maximum second heat flow occurs in a second operating state of the power electronics module, which second operating state is offset with respect to time in relation to the first operating state.

8. The power electronics module as claimed in claim 2, wherein the first power electronics element and the second power electronics element are arranged and configured such that the maximum first heat flow occurs in a first operating state of the power electronics module, and the maximum second heat flow occurs in a second operating state of the power electronics module, which second operating state is offset with respect to time in relation to the first operating state.

9. The power electronics module as claimed in claim 6, wherein the first power electronics element and the second power electronics element are arranged and configured such that the maximum first heat flow occurs in a first operating state of the power electronics module, and the maximum second heat flow occurs in a second operating state of the power electronics module, which second operating state is offset with respect to time in relation to the first operating state.

10. The power electronics module as claimed in claim 7, wherein a magnitude of the first heat flow in the first operating state is greater than a magnitude of the first heat flow in the second operating state, and a magnitude of the second heat flow in the second operating state is greater than a magnitude of the second heat flow in the first operating state.

11. A converter comprising:
at least one power electronics module having:
a first power electronics element that generates a first heat flow during operation of the power electronics module;
a second power electronics element that contributes to the generation of a second heat flow during operation of the power electronics module; and
a secondary cooling circuit having a first cooler,
wherein the first cooler is in thermal contact with the first power electronics element to receive at least part of the first heat flow,
wherein the second cooler is in thermal contact with the second power electronics element to receive at least part of the second heat flow,
wherein the heat exchanger is configured to transfer at least part of the first heat flow and the second heat flow to a primary cooling flow during the operation of the power electronics module, and
wherein the heat exchanger is configured to be thermally efficient for transferring a heat flow such that the magnitude of said heat flow is less than a total magnitude that is formed from the maximum first heat flow and the maximum second heat flow.

12. The converter as claimed in claim 11, wherein the power electronics elements and the first cooler are arranged to form a stack, in which the power electronics elements and the first cooler and a second cooler are arranged in an alternating sequence, wherein the coolers contribute to the generation of the second heat flow.

13. The converter as claimed in claim 11, wherein the primary cooling flow is a liquid cooling flow with a water content, or said primary cooling flow is a gaseous cooling flow, such as an air flow.

14. The converter as claimed in claim 12, wherein the primary cooling flow is a liquid cooling flow with a water content, or said primary cooling flow is a gaseous cooling flow, such as an air flow.

15. The converter as claimed in claim 11, wherein at least one power electronics module can be inserted into and withdrawn from the converter in a drawer-like manner, wherein a heat exchanger is arranged on this power electronics module.

16. The converter as claimed in claim 12, wherein at least one power electronics module can be inserted into and withdrawn from the converter in a drawer-like manner, wherein a heat exchanger is arranged on this power electronics module.

17. The converter as claimed in claim 13, wherein at least one power electronics module can be inserted into and withdrawn from the converter in a drawer-like manner, wherein a heat exchanger is arranged on this power electronics module.

18. The converter as claimed in claim 14, wherein at least one power electronics module can be inserted into and withdrawn from the converter in a drawer-like manner, wherein a heat exchanger is arranged on this power electronics module.

\* \* \* \* \*